United States Patent [19]

Waller

[11] Patent Number: 5,015,883
[45] Date of Patent: May 14, 1991

[54] COMPACT MULTIFUNCTION LOGIC CIRCUIT

[75] Inventor: William K. Waller, Boise, Id.

[73] Assignee: Micron Technology, Inc., Boise, Id.

[21] Appl. No.: 420,139

[22] Filed: Oct. 10, 1989

[51] Int. Cl.[5] ................... G06F 7/38; H03K 17/56; G11C 7/00
[52] U.S. Cl. .................... 307/465; 307/243; 307/469; 365/189.08; 365/189.11
[58] Field of Search .......... 307/243, 443, 445, 448, 307/449, 463, 465, 471, 469; 365/189.08, 189.11

[56] References Cited

U.S. PATENT DOCUMENTS

| | | | |
|---|---|---|---|
| 4,567,385 | 1/1986 | Falater et al. | 307/469 |
| 4,839,539 | 6/1989 | Takata et al. | 307/469 |
| 4,893,031 | 1/1990 | Masuda | 307/469 |
| 4,933,577 | 6/1990 | Wong et al. | 306/469 |

OTHER PUBLICATIONS

Digital Principles and Applications, by Albert Paul Malvino on pp. 100–103.
Digital Fundamentals, fourth edition, by Thomas L. Floyd, pp. 153 and 154.

*Primary Examiner*—Stanley D. Miller
*Assistant Examiner*—Trong Phan
*Attorney, Agent, or Firm*—Susan B. Collier; Stanley N. Protigal; Angus C. Fox, III

[57] ABSTRACT

The invention is a compact multifunction logic circuit, offering low power operation and compact layout. It has utility in computer graphics processing circuitry. Internal and external data and inverse data inputs are provided to the three passthrough gates 21E, 21F and 21G. The circuit is designed so that one and only one of the passthrough gates 21E, 21F and 21G is activated at any given time. Therefore, even though all three passthrough gates 21E, 21F and 21G have inputs supplied by the outputs of NOR 22, XOR 20 and NAND 23 only one of the three gate outputs is passed to the final output node 19.

3 Claims, 4 Drawing Sheets

| FUNCTION | DSL | D*SL | MSL | M*SL | OSEL | ZSEL | OMUX | EMUX | AMUX |
|---|---|---|---|---|---|---|---|---|---|
| CLEAR | | | | | | | | | ✓ |
| CLEAR | | | | | | | | | ✓ |
| SET | ✓ | | | | | | | | |
| SET | | ✓ | | | | | | | |
| M | | | ✓ | | | | | | ✓ |
| M* | | | | ✓ | | | | | |
| D | | ✓ | | | ✓ | ✓ | | | ✓ |
| D* | ✓ | | | | ✓ | ✓ | | | ✓ |
| D AND M | | ✓ | | ✓ | | | ✓ | | ✓ |
| D* AND M | ✓ | | ✓ | ✓ | | | ✓ | | |
| D AND M* | | ✓ | ✓ | | | | ✓ | | |
| D NAND M | ✓ | | ✓ | ✓ | ✓ | ✓ | | | |
| D OR M | | ✓ | ✓ | ✓ | ✓ | ✓ | | | |
| D* OR M | ✓ | | ✓ | | | | ✓ | | |
| D OR M* | ✓ | | | | | | ✓ | | ✓ |
| D NOR M | ✓ | | ✓ | ✓ | | | | | |
| D XOR M | | | | | | | | ✓ | |
| D XNOR M | | | | | | | | ✓ | |

FIG. 4

COMPACT MULTIFUNCTION LOGIC CIRCUIT

BACKGROUND OF THE INVENTION

1. Field of the Invention

This invention has to do with electronic circuitry which can be used, for example, in computer graphics processing. In particular, this is a compact logic circuit which can perform a selection of functions and be integrated on the same substrate as random access memory (RAM) device.

2. Description of the Related Art

An introduction to the device is now presented, with reference to FIG. 1. A multifunction logic circuit L is included, for example, as part of a RAM. It performs a logic function on logic signals D and M, D and M having either a high or low logic level, and stores the output in STORE, which typically might be a RAM cell under access. In this case the logic function is determined by specific design criteria. Multifunction logic circuit L takes as inputs an existing stored bit M, an input data bit D (taken through a RAM input port, not shown), and control signals C.

Typical logic functions include CLEAR, the output low, and SET, the output high, as well as various combinations of AND, OR, and XOR on inputs M, D, and inversions thereof. A logic function in effect until another selection is made. remains in effect until another selection is made. The logic operation is performed whenever data is written through the RAM input port.

This device has great utility in computer graphics applications, where a graphic field mapped in RAM is altered by rastering new values into selected RAM locations.

SUMMARY OF THE INVENTION

The invention is a multifunction logic circuit, offering low power operation and compact layout.

BRIEF DESCRIPTION OF THE DRAWINGS

FIG. 4 is a control table depicting logic function mode selection in the inventive circuit.

DETAILED DESCRIPTION OF THE PREFERRED EMBODIMENT

In a typical DRAM the multifunction logic circuit of the present embodiment is used to modify stored information in a selected cell. The DRAM receives a read signal for a selected cell and the cell's data M and its inverse, M*, are latched. External input data D and its inverse, D*, are also latched. M, M*, D, and D* are then modified according to a selected logic function in the multifunction logic circuit of the preferred embodiment. The resultant multifunction logic circuit output is then rewritten back into the originally selected cell. Thus, the multifunction circuit of the present embodiment implements the modify operation in the read-modify-write sequence of a typical DRAM.

Given FIGS. 2 and 3a-3d, construction of the preferred embodiment is easily attained by one of ordinary skill in semiconductor circuit design and manufacture.

The circuit has four inputs; D, M, the inverse of D, D*, and the inverse of M, M*, as well as an optional high input supplied when P-MOS transistor 10 is activated by a low at gate OSEL 11 and an optional low input when the N-MOS transistor 12 is activated by a high on gate ZSEL 13.

Figure 3D:
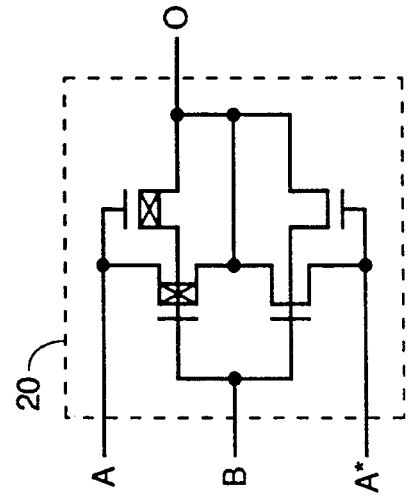
FIGS. 3a -3d detail some elements of the inventive circuitry.
Figure 3B:
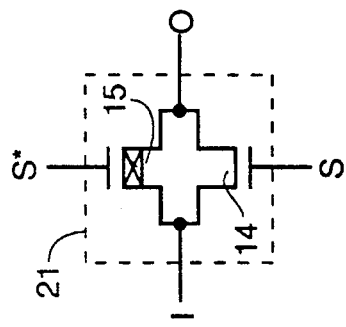
Figure 3C:
Figure 3A:
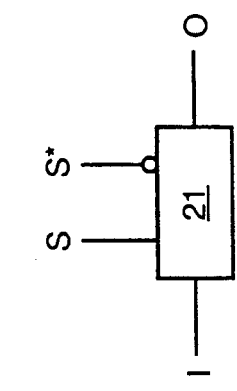

Devices 21 are passthrough gates, and are detailed in FIGS. 3A and 3B. The passthrough gate will either pass the input signal I to the output O or block it. In FIG. 3B the input signal is passed through the passthrough gate when S and its inverse S* activate the N-MOS 14 and P-MOS 15 transistors respectively. The transistors will activate when S is high and S* is low. When S is low and S* is high MOS transistors 14 and 15 are both off and the signal is blocked. Passthrough gates 21A and 21B accept input signals D* and D respectively and cannot be activated simultaneously. Passthrough gates 21C and 21D accept input signals M* and M respectively and cannot be activated simultaneously.

Figure 1:
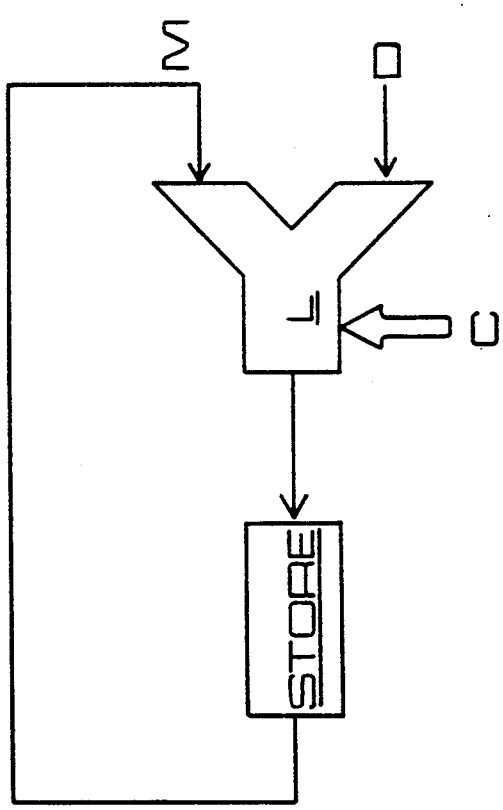
FIG. 1 depicts generic multifunction logic circuit operation.
Figure 2:
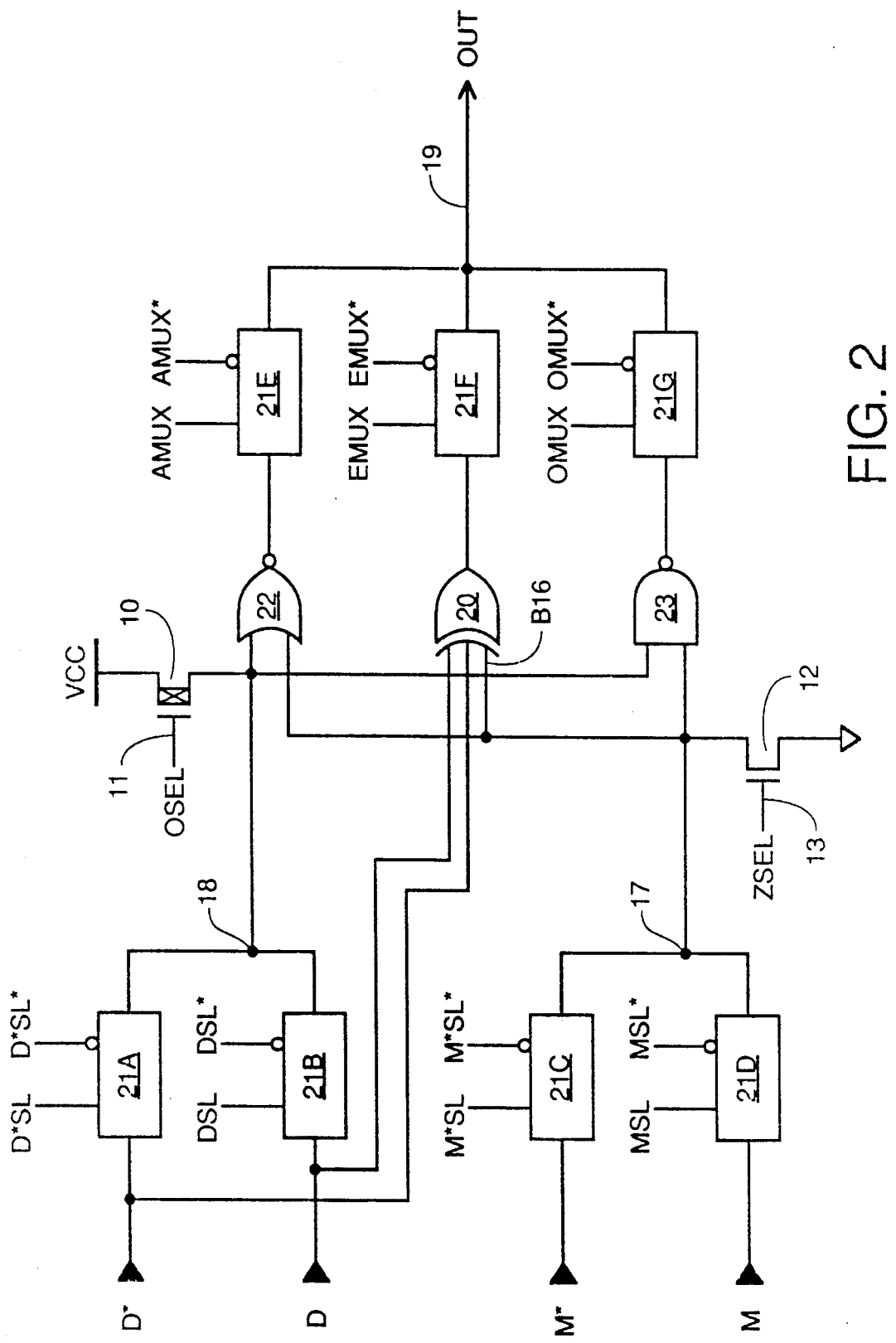
FIG. 2 shows the inventive multifunction logic circuitry.

The XOR gate 20 in FIGS. 2 and 3C has three inputs; D, D*, and B 16. B16 can be pulled low by a high on the gate ZSEL of N-MOS transistor 12 or receive an input from M or M* from the passthrough gate output node 17, when ZSEL is low. An explanation of a 3-input XOR is detailed in Digital Principles and Applications, by Albert Paul Malvino on pages 100-103. In typical RAM manufacture the 3-input XOR gate can be constructed using P-MOS and N-MOS transistors as shown in FIG. 3D to achieve the 3 input XOR logic.

In addition to XOR gate 20, NOR gate 22 and NAND gate 23 provide logic function circuitry for the output. NOR gate 22 and NAND gate 23 have common inputs, one of which is B16. The second input is either a high provided by P-MOS transistor 10 when gate input OSEL 11 is low or input D or D* at passthrough gate output node 18 when OSEL is high.

The circuit is designed so that one and only one of the passthrough gates 21E, 21F, and 21G is activated at any given time. Therefore, even though all three passthrough gates have inputs supplied by the outputs of NOR 22, XOR 20 and NAND 23 only one of the three gate outputs is passed to the final output node 19. An operative understanding of the inventive circuit will be imparted through the following discussion. For a first example, a low on the gate OSEL 11 of P-MOS transistor 10 will provide a clear on the output irrespective of the second input to NOR gate 22 providing passthrough gate 21E is activated and a set condition can be accomplished with a high on the gate ZSEL 13 of transistor 12 provided passthrough gate 21G is activated. For a second example, the inventive circuit is set up to perform the function D and M. Checkmarks in the row marked D and M in FIG. 4 indicate that signals D*SL, and M*SL, and AMUX must be active to select this function. A blank in FIG. 4, as opposed to a checkmark, indicates an inactivate state. Referring now to FIG. 2, AMUX selects the output of NOR gate 22, D*SL selects input D*, and M*SL selects input M*. The circuit performs D* NOR M*, which is the DeMorganized form of D and M. DeMorgan's theorum is explained in Digital Fundamentals, fourth edition, by Thomas L. Floyd, pages 153 and 154.

Given this example, it is clear from FIG. 4 what control signals are necessary to set up the inventive circuit to perform a desired function. FIG. 4 clearly depicts that there are 14 different log functions available for inputs M and D in addition to 2 distinct set and 2 distinct clear operations. Multiple setups are available for each of CLEAR and SET, and possibly other operations.

Clearly, variations are immediately evident that are intended to be circumscribed by these claims. For example, non-differentially driven passthrough gates might be used where signals are not required.

I claim:

1. A multifunction logic circuit having logic signals at high and low logic levels, comprising:
   (a) an output node;
   (b) first, second, and third passthrough gates, said passthrough gates capable of blocking or passing said logic signals to said final output node, said passthrough gates designed such that one and only one of said first, second, and third passthrough gates pass said logic signal to a final output node at any given time;
   (c) a NOR gate, outputting to said final output node via said first passthrough gate, having a first and a second NOR input nodes;
   (d) an XOR gate, outputting to said final output node via said passthrough gate, having a first, a second, and a third XOR input nodes;
   (e) a NAND gate, outputting to said final output node via said third passthrough gate, having a first and a second NAND input nodes;
   fourth, fifth, sixth, and seventh passthrough gates, said passthrough gates capable of blocking or passing said logic signals to at least one of said NAND, NOR, and XOR input nodes, said passthrough gates designed such that only one of said fourth and fifth passthrough gates is capable of passing one of said logic signals at any given time and such that only one of said sixth and seventh passthrough gates is capable of passing one of said logic signals at any given time;
   (g) a first input, an inverted first input, a second input, and a second inverted input, said first and said second XOR input nodes responsive to said first input and said inverted first input respectively;
   (h) a first passthrough gate output node, responsive to said first input and said inverted first input through said fourth and fifth passthrough gates respectively, inputting to said first NOR input node and inputting to said first NAND input node;
   (i) a second passthrough gate output node, responsive to said second input and said inverted second input through said sixth and seventh passthrough gates respectively, inputting to said second NOR input node, said second NAND input node, and said third XOR input node;
   (j) a pullup device activated by a pullup control signal, to selectively pull said first NOR input node and said first NAND input node to a high level, such that said first input and inverted first input are blocked by said fourth and fifth passthrough gates when said pullup device is activated; and
   (k) a pulldown device activated by a pulldown control signal, to selectively pull said second NAND input node and said second NOR input node, and said third XOR input node to said low logic level, such that said second input and said inverted second input are blocked by said sixth and seventh passthrough gates when said pulldown device is activated,
wherein, a combination of inputs is selected by said fourth, fifth, sixth, and seventh passthrough gates and said pullup and pulldown devices, and an output is selected by one of said first, second, and third passthrough gates, so that a predetermined logic function may be performed.

2. The multifunction logic circuit of claim 1, further comprising a RAM storage cell wherein said first input is a stored logic signal from said RAM storage cell, said second input is an input data bit, and an output from said final output node is provided to said RAM storage cell.

3. The multifunction logic circuit of claim 1, wherein said passthrough gates are parallel invertedly gated N-MOS and P-MOS transistors having a common source as an input and a common drain.

* * * * *

UNITED STATES PATENT AND TRADEMARK OFFICE
CERTIFICATE OF CORRECTION

PATENT NO. : 5,015,883
DATED : May 14, 1991
INVENTOR(S) : William K. Waller

It is certified that error appears in the above-indentified patent and that said Letters Patent is hereby corrected as shown below:

Column 1, line 25, beginning with "Typical" should not be a separate paragraph.

Column 1, line 28, after "function," please insert --mode is selected during a setup cycle and remains--.

Column 4, line 40, delete "drain." and insert --drain as an output--.

Signed and Sealed this

Twelfth Day of July, 1994

Attest:

BRUCE LEHMAN

Attesting Officer          Commissioner of Patents and Trademarks